(12) United States Patent
Elliott et al.

(10) Patent No.: US 7,414,359 B2
(45) Date of Patent: Aug. 19, 2008

(54) LOW WORK FUNCTION METAL COMPLEXES AND USES THEREOF

(75) Inventors: C. Michael Elliott, Fort Collins, CO (US); Corey J. Bloom, Bend, OR (US)

(73) Assignee: Colorado State University Research Foundation, Fort Collins, CO (US)

( * ) Notice: Subject to any disclaimer, the term of this patent is extended or adjusted under 35 U.S.C. 154(b) by 536 days.

(21) Appl. No.: 10/524,126

(22) PCT Filed: Aug. 12, 2003

(86) PCT No.: PCT/US03/25150

§ 371 (c)(1),
(2), (4) Date: Feb. 10, 2005

(87) PCT Pub. No.: WO2004/015746

PCT Pub. Date: Feb. 19, 2004

(65) Prior Publication Data

US 2005/0231100 A1 Oct. 20, 2005

Related U.S. Application Data

(60) Provisional application No. 60/403,113, filed on Aug. 12, 2002.

(51) Int. Cl.
*H05B 33/00* (2006.01)

(52) U.S. Cl. ............... 313/503; 546/255; 548/518

(58) Field of Classification Search ............... 546/255; 548/518; 549/59, 479; 313/503–506
See application file for complete search history.

(56) References Cited

U.S. PATENT DOCUMENTS 6,140,503 A   10/2000   Lin et al.

FOREIGN PATENT DOCUMENTS

WO   WO 2004/085450   10/2004

OTHER PUBLICATIONS

Bloom et al., "Low Work Function Reduced Metal Complexes as Cathods in Organic Electroluminescent Devices," J. Phys. Chem. B, 107, 2933-2938, 2003.
Elliott et al., "Transition-metal complex-based tunable work function conductors and their application as cathode materials in OLEDs," Abstracts of Papers, 224th ACS National Meeting, Boston MA, Aug. 18-22, 2002. Online.

*Primary Examiner*—Joseph L Williams
(74) *Attorney, Agent, or Firm*—Don D. Cha; Hamilton, DeSanctis & Cha, LLP

(57) ABSTRACT

The present invention provides conductive metal-ligand coordination complexes that are useful in a variety of electronic devices. For example, such complexes are useful in organic light emitting devices composed of one or more layers of organic material between two conductors. The use of metal-ligand coordination complexes of the present invention as the cathode, replaces the more typically employed reactive metals, which function as the electron injecting contact, and provides for improved or longer-lived devices.

15 Claims, 12 Drawing Sheets

Current vs Voltage Plots for Examples 1-3

- Example 1: [Ru(terpyridine)$_2$]$^0$ cathode
- Example 2: [Cr(bipyridine)$_3$]$^0$ cathode
- Example 3: [Cr(tetramethyl-bipyridine)$_3$]$^0$ cathode

Current vs Voltage Plots for Examples 1-3

- ■ Example 1: [Ru(terpyridine)$_2$]$^0$ cathode
- ● Example 2: [Cr(bipyridine)$_3$]$^0$ cathode
- ▲ Example 3: [Cr(tetramethyl-bipyridine)$_3$]$^0$ cathode Light vs Voltage Plots for Examples 1-3

Cyclic voltammetry of the Cr complexes. The fourth reduction of the Cr(TMB)$_3$ complex is obscured by the solvent window.

XPS survey spectrum of vapor deposited Ru(terpy)$_2^0$.

Performance of a typical OLED with a $[Ru(terpy)_2]^0/Ag$ cathode.

Performance of four OLEDs with cathodes of varying LWOMs and covering metal layers.

Current (I) vs. Voltage (V) graph of a "hole-only" device with silver, along with the analogous OLED (from Figure 7).

Current (I) vs. Voltage (V) graph of a "hole-only" device with gold, along with the analogous OLED (from Figure 7).

Performance of OLEDs with $[Cr(bpy)_3]^0$/Ag cathodes with increasing thickness of $[Cr(bpy)_3]^0$ Current-voltage performance of an OLED of construction Ag/[Ru(terpy)$_2$]$^0$/Alq$_3$/TPD/PEDOT-PSS/ITO and a fit to the equation I $\propto$ e$^{cV}$

LOW WORK FUNCTION METAL COMPLEXES AND USES THEREOF

CROSS-REFERENCE TO RELATED APPLICATIONS

This application claims the priority benefit of PCT/US2003/025150, filed 12 Aug. 2003, now International Publication No. WO 2004/015746 A2, published 19 Feb. 2004, which claims the priority benefit to U.S. Provisional Application No. 60/403,113, filed 12 Aug. 2002, both of which are incorporated herein by reference in their entirety.

STATEMENT REGARDING FEDERALLY SPONSORED RESEARCH

The U.S. Government has a paid-up license in this invention and the right in limited circumstances to require the patent owner to license others on reasonable terms as provided for by the terms of Grant No. CHE-0139637 awarded by National Science Foundation.

FIELD OF THE INVENTION

This invention relates to heteroaryl-metal coordination complexes having a low work function and methods for use thereof.

BACKGROUND OF THE INVENTION

Organic light emitting devices (i.e., OLEDs) produce light emission upon application of current. See, for example, Tang and VanSlyke, *Appl. Phys. Lett.*, 51, (1987), p. 913-915; Burroughs, et al., *Nature*, 347, (1990), p. 539-541. In a simplest form, OLEDs are comprised of one or more thin layers of organic light emissive materials sandwiched between two conductors (i.e., electrodes). An applied potential across the electrodes injects electrons and holes from the cathode and anode, respectively, ultimately producing an excited state light emissive material. Light is produced by photon emission by the excited light emissive material as it returns to the ground state. Preferably, the barrier to electron or hole injection at both electrode interfaces should be kept low to reduce power consumption.

A wide variety of organic materials have been used to transport charge (electron or hole) from the electrode to the light emissive material. However, the requirements for the cathode and anode are such that relatively few choices are available. Specifically, it is important that the work functions of the electrodes are well matched to the appropriate energy levels in the organic charge transport materials.

Conventional efforts have focused on OLEDs using tris(8-hydroxyquinoline) aluminum(III) complex ($Alq_3$) as the light emissive and electron transport layer, and a triarylamine compound as the hole transport medium. The advantage of this approach lies in part in the emission of light at or near the interface between the two organic layers.

Without being bound by any theory, it is believed that a low barrier for injection should be provided when the Fermi energy of the cathode is closely matched to the lowest unoccupied molecular orbital (LUMO) energy of the light emitting (or electron transport) layer. To this end, low work function ($\Phi$) metals such as magnesium, calcium, and aluminum, or their alloys with silver are the most commonly used materials. See, for example, Tang et al., *Appl. Phys. Lett.*, 1987, 51, 913; Burrows et al., *Appl. Phys. Lett.*, 1994, 64, 2285; and Matsumura et al., *J. Appl. Phys.*, 1996, 79, 264.

Recently, thin layers of insulators and wide band gap semiconductors between the conducting cathode and the active organic material have been utilized. Specifically, inorganic insulators such as LiF, $Li_2O$, $MgF_2$, and MgO under aluminum metal have been widely used, (see Hung et al., *Appl. Phys. Lett.*, 1997, 70, 152; Jabbour et al., *Appl. Phys. Lett.*, 1997, 71, 1762; Matsumura et al., *Appl. Phys. Lett.*, 1998, 73, 2872; and Lee, *Synth. Met.*, 1997, 91, 125) and copper phthalocyanine (CuPc) has been paired with the high work function conducting metal oxide indium tin oxide (ITO) (Parthasarathy et al., *Appl. Phys. Lett.*, 1998, 72, 2138) to produce a reasonably efficient transparent OLED. Doping of lithium metal into $Alq_3$ by codeposition has also been reported. Kido et al., *Appl. Phys. Lett.*, 1998, 73, 2866.

Often the anode is composed of a transparent conducting oxide such as indium-tin oxide (ITO), the high work function of which is well matched in energy to the highest occupied molecular orbital (or valance band) in the light-emitting material. The cathode generally contains a low work function metal, for example, calcium or magnesium, such that the barrier for injection of electrons into the lowest unoccupied molecular orbital (or conduction band) of the organic layer, e.g., light-emitting material, is as small as possible. To provide more stability, these metals are typically alloyed with or covered by silver or gold.

The failure mechanism for such light-emitting devices is generally associated with degradation of the cathode. Tang et al., *Appl. Phys. Lett.*, 1987, 51, 913-915. Other problems including oxide buildup and localized heating have also been attributed to this interface. See, for example, Choung et al., *Appl. Phys. Lett.*, 1998, 72, 2689-2691; and Burroughs, et al., *Nature*, 1990, 347, 539-541.

Other approaches have been shown to improve performance at the cathode/organic interface. One method involves placing a very thin layer of an insulating salt such as LiF, MgO (Hung et al., *Appl. Phys. Lett.*, 1997, 70, 152-154), $MgF_2$ (Lee, *Synth. Met.*, 1997, 91, 125-127) or $Al_2O_3$ (Tang et al., *Appl. Phys. Lett.*, 1997, 71, 2560-2562) separating the organic material and an aluminum metal covering. Devices of this type are more efficient and have longer operating lifetime than previous models.

A series of low $\Phi$ conducting polymers have also been reported, one of which was used in conjunction with ITO as a cathode in an "inverted type" OLED. Bloom et al., *J. Am. Chem. Soc.*, 2001, 123, 9436. The materials were composed of redox active substituted transition-metal diimine complexes, which as thin films were thermally polymerizable. Electrochemical reduction of the polymers yielded conductive films with work functions (which could be predicted from cyclic voltammetry of the monomers) from 3.7 to 3.0 eV. An OLED consisting of the layers gold/TPD/$Alq_3$/polymer/ITO was reported where gold was the anode. (TPD is a commonly used organic hole transport material). While this type of device produces light under a moderate voltage bias, the performance was not optimal.

The latter strategy involves the use of a series of conducting polymers having a low work function, one of which was used as a cathode material for an OLED. Without being bound by any theory, it is believed that cathodes comprising a conductive organic material would be inherently more compatible with the light-emitting (i.e., luminescent) materials than the metals that are typically employed. There are inherent limitations of this system that make it of limited utility for the construction of devices, however, including the necessity of post-polymerization electrochemical processing of the polymers.

In view of the problems associated with current OLEDs, it is evident that there is a need for other low work function materials that can be used in a variety of electronic devices, such as OLEDs.

SUMMARY OF THE INVENTION

The present invention provides heteroaryl-metal coordination complexes and methods for use thereof. In one embodiment, the heteroaryl-metal coordination complexes can be electrochemically or chemically reduced, preferably at a potential more negative than −−0.5 volts vs. a saturated calomel electrode (SCE), to produce a material that is electronically conducting in the solid state.

In another embodiment, the reduced heteroaryl-metal coordination complexes can be deposited, e.g., by vacuum vapor deposition, to form electronically conducting thin films. These reduced materials have low work functions, and can thus function as electrodes, preferably cathodes, for OLEDs, where they can be in contact with any suitable conductive material to provide a stable and rugged electrical contact.

The energies of the relevant reductions in a given heteroaryl-metal coordination complex, and therefore the work function of a given redox form or redox forms in the solid state, can be controlled by synthetic modification of the starting material. In this manner, an electrode can be essentially tailor made with the desired work function to match an active organic layer of interest.

DETAILED DESCRIPTION OF THE INVENTION

Abbreviations

Figure 1:
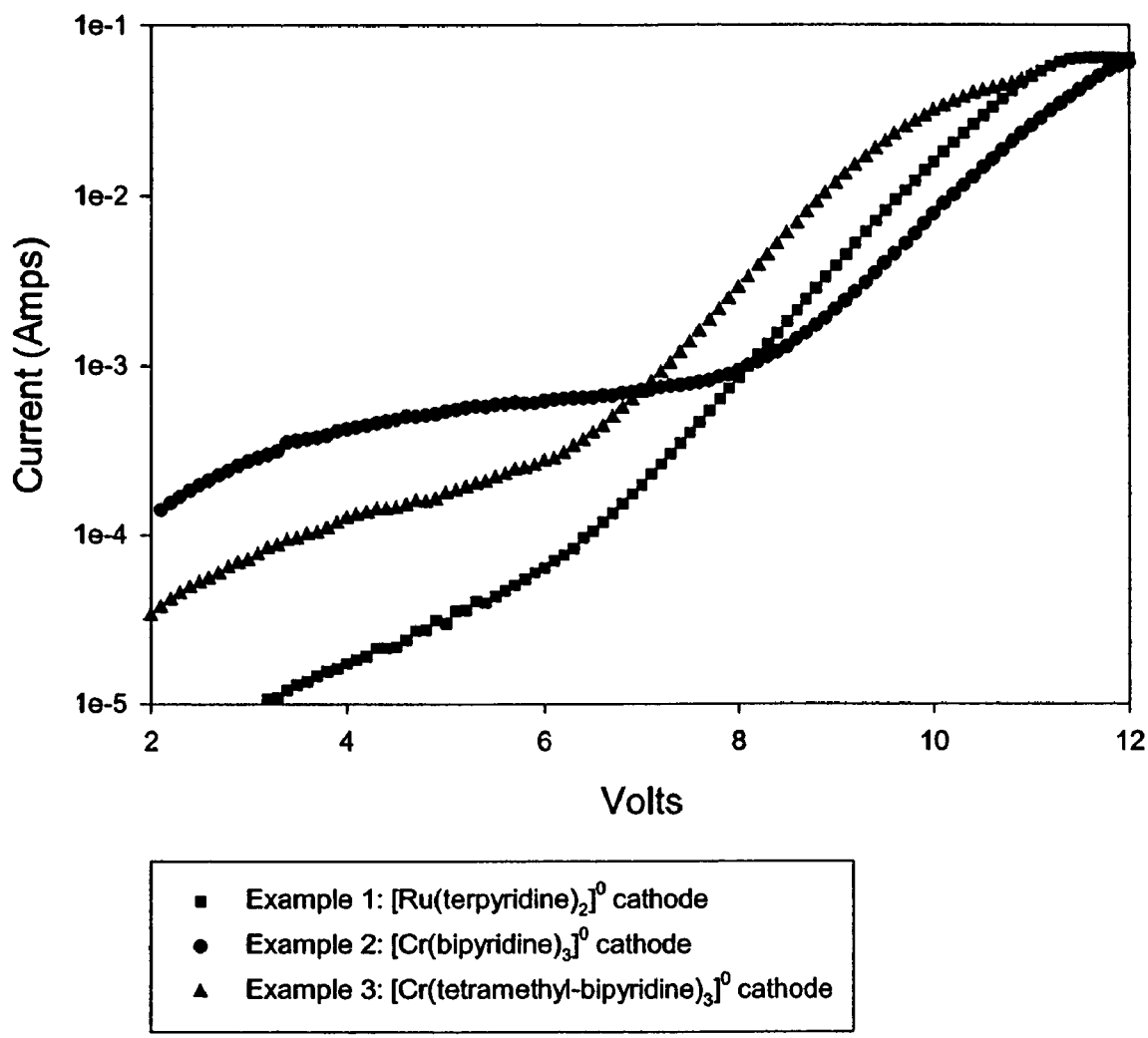
FIG. 1 shows a graph of Current vs. Voltage plots for Example 1-3.

Unless the context requires otherwise, the following abbreviations are used throughout this application.
LWOM=low work function organic materials
ITO=indium-tin oxide
TMB=4,4',5,5'-tetramethyl-2,2'-bipyridine
bpy=2,2'-bipyridine
terpy=2,2':6',2"-terpyridine
TPD=N,N'-bis(3-methylphenyl-N,N'-diphenylbenzidine)
PEDOT-PSS=poly(styrenesulfonate)-poly(2,3-dihydrothieno-[3,4-b]-1,4-dioxin)
NHE=normal hydrogen electrode
SSCE=saturated sodium chloride calomel
HBEC=high binding energy cutoff Definitions Alkyl groups for the present invention are aliphatic hydrocarbons which can be straight or branched chain groups. Alkyl groups optionally can be substituted with one or more substituents, such as a halogen, aryl, hydroxy, amino, thio, alkoxy, carboxy, or oxo. There may be optionally inserted along the alkyl group one or more oxygen, sulfur, or substituted or unsubstituted nitrogen atoms.

The term "cycloalkyl" refers to a monovalent mono-, di-, tri-, or tetra-cyclic hydrocarbon moiety. The cycloalkyl can be optionally substituted independently with one more of the following groups: alkyl, halide, hydroxyl, amino, carboxyl, aryl, or heteroaryl. In addition, one or more ring carbon atoms of the cycloalkyl group can be replaced with a heteroatom such as nitrogen, oxygen, sulfur, phosphorous, or a combination thereof.

The term "aryl" refers to an aromatic ring moiety, such as mono-, bi-, or tri-cyclic aromatic ring species. Aryl groups can be substituted with one or more substituents described above for the alkyl group.

The term "heteroaryl" means a monovalent mono-, bi-, tri-, or tetera-cyclic aromatic moiety containing one or more heteroatoms selected from N, O, P, S, or combinations thereof, the remaining ring atoms being C. The heteroaryl ring can be optionally substituted independently with one or more substituents described above for the alkyl group.

An "ester" group is of the form —CO(OR$_x$) where R$_x$ can be alkyl, aryl, or heteroaryl. An "amide" function is comprised of —CO(NR$_y$R$_z$) where R$_y$ and R$_z$ can be the same or different and are defined the same as R$_x$.

Unless otherwise stated, work function values given in the present application are predicted work function values derived from solution-phase cyclic voltammetry of the parent complexes.

General Overview

The present invention provides metal-ligand coordination complexes that have a low work function, preferably 3.5 eV or less. Such complexes are useful in a variety of electronic devices where a low power consumption in transfer of electrons from one interface to another is desired. Preferably, metal-ligand coordination complexes of the present invention comprise redox active metal complexes. In this manner, metal-ligand coordination complexes can be isolated in the formally zero-charged state, for example, via reductive electrocrystallization. In one specific embodiment, the reduced (i.e., formally zero-charged state) metal-ligand coordination complexes are used as electrode, e.g., cathode, materials in organic light-emitting devices.

In one particular embodiment, metal-ligand coordination complexes of the present invention are thermally evaporated or vacuum vapor deposited on to a substrate to form conducting thin films with low work functions. Such deposition processes provide a variety of advantages over the conventional polymers in OLED applications. For example, by eliminating the necessity of postpolymerization electrochemical processing, metal-ligand coordination complexes of the present invention are easier to use and allow a much greater variety of device architectures, and/or more pure material deposition.

Metal-Ligand Coordination Complex

In one aspect of the present invention, at least one ligand of metal-ligand coordination complex is a heteroaryl moiety. Such metal-ligand coordination complexes are also referred herein as heteroaryl-metal coordination complexes. A particularly preferred heteroaryl moiety is polypyridyl, phenanthroline, or a derivative thereof, with polypyridyl or a derivative thereof being an especially preferred heteroaryl moiety. Such complexes are useful in a variety of electronic applications, including as electrodes, preferably cathodes, in OLEDs.

In one particular embodiment, the heteroaryl-metal coordination complex is of the formula:

$$[M\text{-}(L)_a]_m Y_n \qquad \text{I}$$

where M is a metal, L is a ligand, Y is a counterion, a is an integer from 1 to 6 inclusive, and m and n are absolute value of the oxidation state of Y and [M-(L)$_a$], respectively.

Referring to Formula I, the subscript a represents the number of ligands present on the metal M. For example, when M contains six ligands and L is a bidentate ligand, a is 3. For the same M requiring 6 ligands, if L is a tridentate ligand, then a is 2.

In Formula I, each ligand, L, is independently a mono- or polydentate ligand, preferably a mono- or polydentate heteroaryl moiety containing one or more, preferably two or three, coordinating heteroatoms that coordinate with the metal M. Suitable heteroatoms include N, O and S(O)$_x$, where x is 0, 1 or 2. A particularly preferred heteroatom is N or O, with N being an especially preferred heteroatom. In one particular embodiment, the heteroaryl moiety is preferably comprised of two or more heteroaryl groups that are fused or are covalently bonded together. While each L can be independent of the other, it is preferred that all the ligands, L, be of the same moiety.

In one particular embodiment, L is a heteroaryl moiety selected from polypyridyl, phenanthroline, and a derivative thereof.

In one embodiment, each L is independently optionally substituted 2,2'-bipyridyl, optionally substituted 1,10-phenanthroline, optionally substituted 2,2',6',2"-terpyridyl or a derivative thereof. In one particular embodiment, all the L's are same.

In another embodiment, L is polypyridyl. A particularly preferred polypyridyl is selected from 4,4',5,5'-tetramethyl-2,2'-bipyridyl (TMB); 2,2'-bipyridyl (bpy); and 2,2',6',2"-terpyridyl (terpy).

Exemplary polypyridyl moieties of L include the following chemical structures:

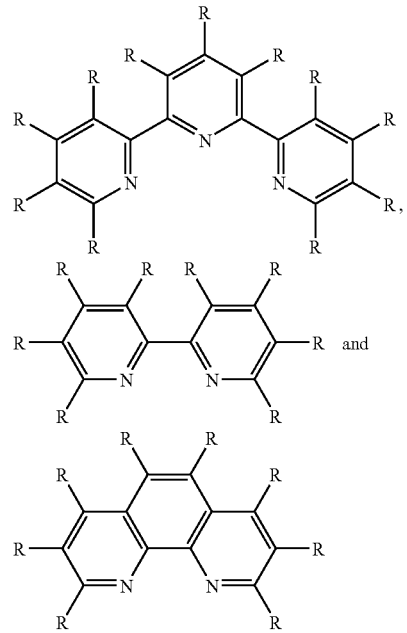

where each R is independently a substituent known to one skilled in the art, preferably a substituent selected from the group consisting of hydrogen, alkyl, cycloalkyl, aryl, heteroaryl, ester, amide, halide, and an electron donating group. Electron donating groups are well known to one skilled in the art and include substituents such as hydroxy, alkyl, cycloalkyl, aryl, alkoxy, aryloxy, cycloalkyloxy, amino, mono- and di-alkyl amino. The substituents R may all be the same or different.

In one particular embodiment, L is a moiety of the formula:

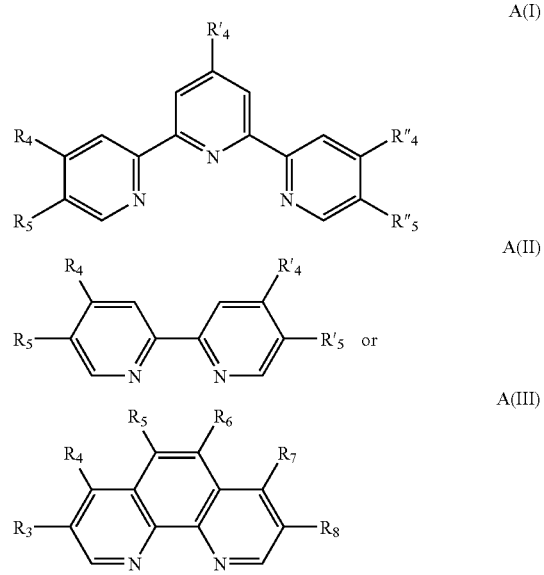

where each of the substituents R is independently those defined herein and the subscript indicates the position of the substituent.

A particularly group of preferred ligand A(I) are those where $R_4=R'_4=R''_4=R_5=R''_5=H$; and $R_4=R'_4=R''_4$=methyl and $R_5=R'_5=H$. A particularly group of preferred ligand A(II) are those where $R_4=R'_4=R_5=R'_5$=methyl; and $R_4=R'_4=R_5=R'_5=H$.

Referring again to Formula I, M is a metal, which may or may not itself exist in more than one stable oxidation state. Preferably, M is a transition metal. More preferably, M is a metal selected from Ru, Cr, Fe, Zn, Co, Mn, Cu, Os, Rh, and Ni. A particularly preferred M is Ru, Cr, or Fe, with Ru and Cr being an especially preferred M group.

The variable Y in Formula I represents a counterion, e.g., either anion or cation, necessary to maintain an overall electroneutrality of the metal-ligand coordination complex. While Y can sometimes affect the solubility or other properties of the complex, the exact nature of Y is in general not critical.

When the mean formal charge on $[M\text{-}(L)_a]$ in the solid material is not zero and is an integer, the variables m and n are absolute values of the oxidation state of the counterion (or sum of the charges on multiple counterions) and the metal-ligand complex, respectively. When the mean formal charge on $[M\text{-}(L)_a]$ in the solid material is zero no Y is present and the formula of the metal-ligand complex is simply $M\text{-}(L)_a$, where M, L and a are those defined herein. When the material is mixed-valent such that the mean charge per metal complex is a non-integer, then n=1 and m is the absolute value of the quantity obtained by dividing the oxidation state of Y by the mean charge per $[M\text{-}(L)_a]$. An example of such a mixed-valent material is one containing equal molar amounts of $[M\text{-}(L)_a]$ with a formal charge of 2+ and $[M\text{-}(L)_a]$ with a formal charge of 1+. The mean charge on $[M\text{-}(L)_a]$ in such a material would thus be 1.5+. If Y is a monoatomic anion with an oxidation state of 2−, then n=1 and m=|(1.5)/(−2)|=0.75. When counterion Y is present, preferred counter anions are $PF_6^-$, $ClO_4^{31}$, $BF_4^-$, and $NO_3^-$. Preferred counter cations are $Li^+$, $Na^+$, $K^+$, $Cs^+$, $Rb^+$, and $NR_4^+$ where R is a straight or branched chain alkyl containing 1 to 8 carbon atoms.

In one particularly preferred embodiment, the complex is not charged and thus no counterion is present and the formula of the complex is simply $M\text{-}(L)_a$. Such neutral metal-ligand coordination complex can be obtained by reducing a corresponding positively charged metal-ligand coordination complex as discussed below.

In one embodiment, the metal-ligand complex of the present invention is selected from compounds of the formula: $[Ru(\text{Ligand A(I)})_2]_m Y_n$; $[Fe(\text{Ligand A(I)})_2]_m Y_n$; $[Cr(\text{Ligand A(II)})_3]_m Y_n$; and $[Cr(\text{Ligand A(III)})_3]_m Y_n$.

Preferably, the metal-ligand complex is in formally zero-charged state, i.e., uncharged, and Y is not present (i.e., m is 1 and n is zero).

In another embodiment, the average charge per metal-ligand coordination complex is not specified and may be positive, zero, or negative. Conductive films of metal-ligand coordination complex can be prepared from solutions of metal-ligand coordination complex by spin coating, spray coating, dip coating, or any other conventional methods known to one skilled in the art of forming a thin film on a substrate surface, for example, vapor deposition including vacuum vapor deposition of a solid metal-ligand coordination complex. The film can be applied first to a conductor or can be applied to materials, e.g., the organic or light-emitting layer, directly. The $[M\text{-}(L)_a]$ film can serve as the cathode alone or it can be contacted with other conductors or insulators.

When the metal-ligand coordination complexes are electrically non-neutral, i.e., the metal is in the oxidation state of 1+ or higher, such metal-ligand coordination complexes can be reduced, e.g., by electrochemical or chemical reduction, to produce metal-ligand coordination complexes of the formally zero-charged state. Such electronically neutral metal-ligand coordination complexes are electronically conductive. In one particular instance, the electroconductivity of such neutral metal-ligand coordination complex was found to have resistivity, ρ, of about $1 \times 10^3$ Ω·cm.

Without being bound by any theory, the conductivity and low work functions can be explained by considering the consequences of the proximal redox processes, as predicted by the Nernst equation. Because of thermal energy, at least three oxidation states (1+, 0, and 1−, where the charged species are present in equal numbers) are present in moderate concentration at room temperature in the reduced, i.e., formally zero-charged, state of metal-ligand coordination films. Furthermore, because the LUMO energy of the free ligands can be controlled by synthetic alterations, e.g., different substituents or heteroaryl moieties, the work function, Φ, of the metal-ligand coordination complexes can be modified.

As stated above, the Φ can be estimated or predicted by cyclic voltammetry of the metal-ligand coordination complex in solution from the average of the $E_{1/2}$ of the 1+/0 and 0/1− couples. In general, the same factors that apply to the conductivity and Φ of the previously described polymers (Bloom et al., *J. Am. Chem. Soc.* 2001, 123, 9436) also apply to solids composed of neutral metal-ligand coordination complexes with similar redox properties.

Metal-ligand coordination complexes of the present invention are redox active and are believed to possess numerous oxidation states with small voltage separations. As stated above, neutral complexes can be produced by electrochemical or chemical reduction of the complex, by adding a number of electrons equal to the initial positive charge. Also, by virtue of a lack of formal charge, isolation of the zero-valent form is often simple because of the different solubility than the charged species. For example, the solid-state compounds $[Ru(bpy)^3]^0$ and $[Ru(terpy)_2]^0$ can be prepared by reductive electrocrystallization from the 2+ species.

Additional objects, advantages, and novel features of this invention will become apparent to those skilled in the art upon examination of the following examples thereof, which are not intended to be limiting.

EXAMPLES

General

Acetonitrile (Aldrich Optima grade) was stored over 4 Å molecular sieves, and distilled from $CaH_2$. Ammonium hexafluorophosphate ($NH_4^+PF_6^-$) was supplied by Elf Atochem and tetra-n-butylammonium hexafluorophosphate ($TBA^+PF_6^-$) electrolyte was prepared as previously described by the present inventor. Elliott et al., *J. Electroanal. Chem.* 1986, 197, 219. The ligand 4,4',5,5'-tetramethyl-2,2'-bipyridine (TMB) was produced by a coupling reaction of 3,4-lutidine (Aldrich) over Pd on C, followed by recrystallization from ethyl acetate. 2,2'-Bipyridine (bpy) was purchased from Baker, and 2,2':6',2''-terpyridine (terpy) from Aldrich, and both were used without further purification. $Alq_3$ and TPD, from Aldrich, were purified by vacuum train sublimation with Argon gas flow at 330° C. and 270° C., respectively. Chromic chloride was supplied by Fisher. Gold of purity 99.99% was purchased from Alfa Aesar, and 99.9999% pure silver from Sargent-Welch. The conducting polymer dispersion, poly(styrenesulfonate)-poly(2,3-dihydrothieno-[3,4-b]-1,4-dioxin) 1.3 wt % in $H_2O$ (PEDOT-PSS), was supplied by Aldrich. ITO, 4-8 Ω/sq. on glass, was purchased from Delta Technologies, Ltd.

Example 1

The complex [Ru(2,2',6',2"- terpyridine)$_2$]$^{2+}$(PF$_6^-$)$_2$ was synthesized as follows. Terpyridine (100 mg, 0.429 mmol) in 10 mL ethylene glycol was added to Ru-(DMSO)$_4$Cl$_2$ (95 mg, 0.196 mmol) in 4 mL 1:1 methanol/water. The mixture was heated under N$_2$ via an oil bath held at 100° C. for 2.5 h, producing a dark reddish solution which was then cooled to room temperature. Water was added to reach a total volume of 75 mL and NH$_4^+$PF$_6^-$ was added whereupon a red/orange precipitate formed. The solid was washed well with H$_2$O and recrystallized from methanol to yield brick red crystals.

Inside an inert atmosphere glove box, the complex was electrochemically reduced in a three compartment bulk electrolysis cell at −2.00 V vs Ag/Ag$^+$ 0.1 $\underline{M}$ in DMSO in an CH$_3$CN electrolyte solution. Crystals of the reduced complex [Ru(2,2',6',2"-terpyridine)$_2$]$^0$ formed on the working electrode and were dislodged and isolated. In this state, the complex can be evaporated in a vacuum thermal deposition chamber, and is used in the same manner as other standard depositable small molecule compounds in OLEDs.

A patterned ITO substrate was cleaned by sonication in an aqueous cleaning solution and covered with a layer of the conducting polymer PEDOT-PSS, and was then placed in a vacuum deposition chamber for further processing. A thin layer of the organic hole transport material TPD (N,N'-Bis(3-methylphenyl)-N,N'-diphenylbenzidine) was then deposited, followed by the emitting material tris(8-hydroxyquinoline) aluminum (III) complex, known as Alq$_3$. In this example, an approximately 100 Å thick layer of the neutral complex [Ru(2,2',6',2"- terpyridine)$_2$]$^0$ was deposited over the Alq$_3$, followed by a covering layer of silver or gold metal. The layers in the device were thus as follows: M/[Ru(2,2',6',2"-terpyridine)$_2$]$^0$/Alq$_3$/TPD/PEDOT-PSS/ITO, where M is either Ag or Au.

OLEDs produced in the above manner were tested by simultaneously measuring the current-voltage response and the resulting light power output. The polarity of the voltage applied was positive on the ITO anode and negative to the silver/metal-complex cathode.

Example 2

The complex [Cr(2,2'-bipyridine)$_3$]$^{3+}$(ClO$_4^-$)$_3$ was synthesized using a modified literature procedure. See, for example, Pecsok et al., *J. Am. Chem. Soc.*, 1950, 72, 189-193; and Baker et al., *Inorg. Chem.*, 1965, 4, 848-854.

Briefly, CrCl$_3$·6H$_2$O (1.33 g, 0.0050 mol) was refluxed under N$_2$ in 0.05 M HClO$_4$ (Mallinckrodt) over Al metal (Baker) to produce a blue/green solution likely containing both Cr$^{2+}$ and Cr$^{3+}$. This solution was added to a N$_2$-purged suspension of bpy (7.81 g, 0.050 mol) in aqueous HClO$_4$ of pH 2. A black suspension was quickly formed, which slowly turned yellow (indicating formation of the [Cr(bpy)$_3$]$^{3+}$ complex) upon bubbling with O$_2$ for 2 h. The yellow solid was collected by filtration, washed well with water, ethanol, and CH$_2$Cl$_2$ (to remove excess ligand), and finally recrystallized from water.

As described in Example 1, the complex was electrochemically reduced to form [Cr(2,2'-bipyridine)$_3$]$^0$ in the nitrogen glove box at −1.90 V vs Ag/Ag$^+$ 0.1 $\underline{M}$ This complex was then evaporated over Alq$_3$ and covered with metal to form a cathode in an OLED and tested for performance.

Example 3

The complex [Cr(4,4',5,5'-tetramethyl-2,2'-bipyridine)$_3$]$^{3+}$(ClO$_4^-$)$_3$ was synthesized in a similar fashion as the bipyridine complex in Example 2. However, the procedure of Example 2 was changed slightly by using much less TMB ligand (0.50 g), because in this case the large excess was not unnecessary, and 0.285 g chromic chloride. The resulting yellow solid was washed with ethanol and boiling hot water.

As described in Example 1, the complex was electrochemically reduced to [Cr(4,4',5,5'-tetramethyl-2,2'-bipyridine)$_3$]$^0$ by holding the working electrode at −2.15 V vs Ag/Ag$^+$ 0.1 M in DMSO. An OLED was constructed in this example consisting of the layers: Ag/[Cr(TMB)$_3$]$^0$/Alq$_3$/TPD/PEDOT-PSS/ITO, and tested for performance.

Figure 2:
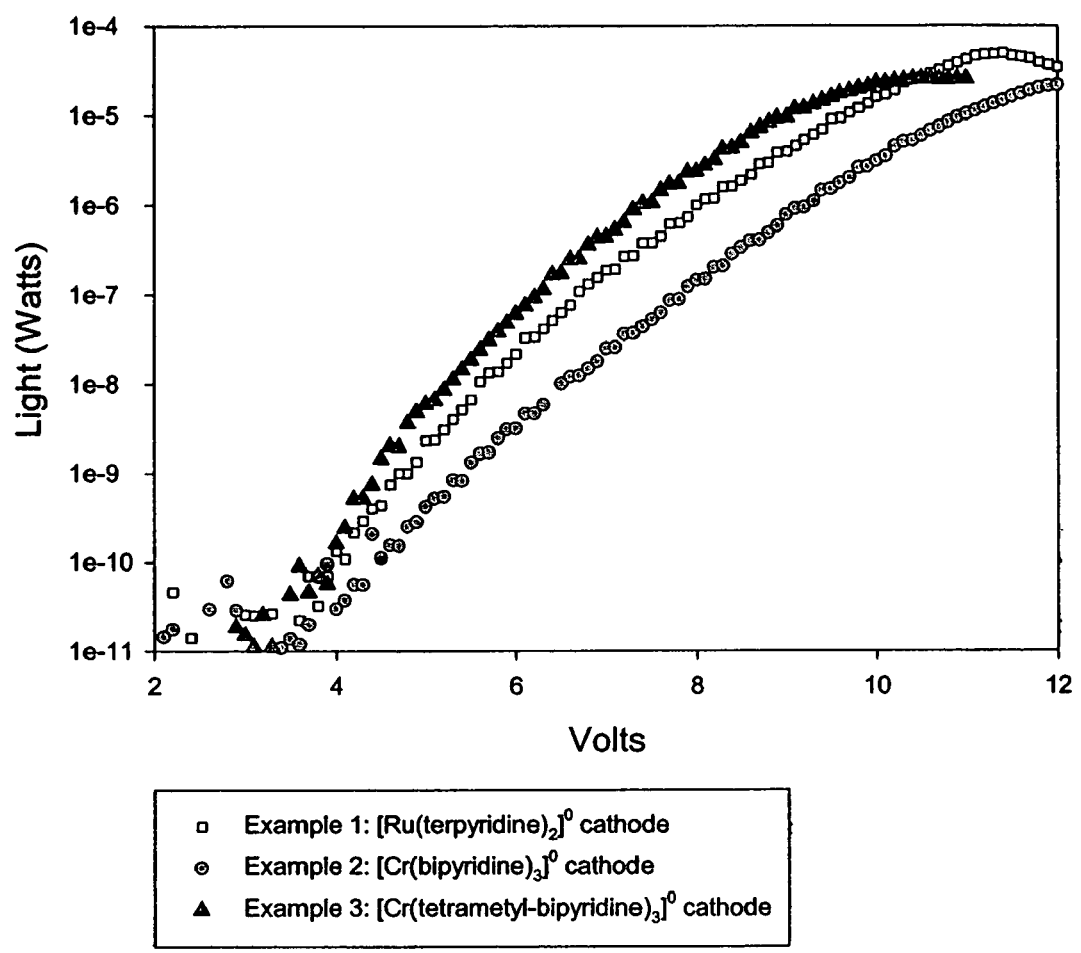
FIG. 2 shows a graph of Light intensity vs. Voltage plots for Example 1-3.

Current vs voltage and light output vs voltage charts for the OLEDs described in Examples 1-3 are depicted in FIGS. 1 and 2. The data shows that the devices produce light with an onset voltage of 3 to 4 Volts, and have an intense emission of up to 6×10$^{-5}$ Watts for a device with an area of ca. 0.3 cm$^2$.

Example 4

Cyclic voltammetry was performed in a Luggin capillary cell with a Ag/Ag+0.1 M in dimethyl sulfoxide (DMSO) [0.41 V vs normal hydrogen electrode (NHE)] reference electrode, Pt wire counter, and glassy carbon working electrode, in 0.1 M TBA$^+$PF$_6^-$ in CH$_3$CN electrolyte. The scan rate was 50 mV/s. Electronics consisted of a P.A.R. model 173 Potentiostat and model 175 Programmer with output to a Yokogawa X/Y recorder.

Example 5

This example illustrates electrocrystallization process.

The three complexes were electrocrystallized following a modification of a method described in the literature. Perez-Cordero et al., *Helv. Chim. Acta*, 1994, 77, 1222 and Pyo et al., *Inorg. Chem.*, 1999, 38, 3337.

Briefly, a three-compartment bulk electrolysis cell was used in an inert atmosphere glovebox with the same electrolyte, reference, and counter electrodes as above, and a Pt mesh working electrode (WE). To produce [Ru(terpy)$_2$]$^0$, 50 mg of [Ru(terpy)$_2$]$^{2+}$(PF$_6^-$)$_2$ was added to the WE compartment, and vigorously stirred. The WE was held at a constant potential of −2.00 V (several hundred millivolts past the second reduction as determined from cyclic voltammetry) until the current decayed from approximately 500 mA to less than 100 µA during the course of several hours. The WE, which was covered with purple/black crystals of the reduced complex, was disconnected from the potentiostat and removed from the electrolysis solution. These crystals were dislodged from the WE in fresh CH$_3$CN, collected on a fritted filter, and washed with more acetonitrile. The solid was dried by passage of glovebox atmosphere over the solid with a vacuum pump, and scraped into a boat for thermal deposition. Crystals of [Cr(bpy)$_3$]$^0$ and [Cr(TMB)$_3$]$^0$ were prepared in the same manner, but at controlled potentials of −1.90 V and −2.15 V vs Ag/Ag$_+$ 0.1 M in DMSO, respectively.

Example 6

Photoelectron Spectroscopy

All photoelectron spectroscopy work was performed in an Omicron multiprobe UHV chamber (base pressure 5×10$^{-11}$ Torr) equipped with a VSW EA125 single-channel analyzer. A transfer rod assembly was used which could be moved into the glovebox for sample preparation, and the sample isolated from the atmosphere behind a gate valve. This assembly was affixed to the entry chamber of the UHV system and pumped down to vacuum before introducing the sample into the analysis chamber. The X-ray source was the Mg Kα line at 1253.6 eV. The UV light source was a helium arc lamp, providing a He(I) line at 21.22 eV and a He(II) line at 40.81 eV. A −5.00 V bias was applied to the sample to separate the spectrometer and sample high binding energy cutoffs. Kinetic energy analysis of electrons emitted normal to the sample was done using a 10 eV pass energy. The spectrometer was calibrated with an Ar$^+$ ion sputtered copper standard. A straight line was fit on the secondary edge of the UPS He(I) spectrum (and the XPS spectrum). The intercept of this line with the abscissa determines the high binding energy cutoff (HBEC). A value of 0.1 eV was subtracted from the HBEC to correct for spectrum broadening due to thermal and analyzer effects. The work function was determined by subtracting this value from the source energy of 21.22 eV.

Example 7

OLED Construction

After rinsing in ethyl acetate and isopropyl alcohol, patterned ITO substrates were cleaned in a laminar flow hood by successive sonication in a 5% aqueous solution of VWR aquasonic cleaner followed by Millipore water. For devices including PEDOT-PSS, the polymer suspension was filtered through a 0.2-μm cellulose acetate syringe filter (Nalgene) and spin coated onto an ITO substrate at approximately 1000 rpm using a modified commercial blender. The substrates were introduced first into the glovebox and then the vacuum deposition chamber (Denton DV 502A Turbo model) that is directly interfaced with the glovebox. Organic materials and metals were sequentially deposited at pressures below 3×10$^{-6}$ Torr. The thickness of the various layers was measured by a Leybold Inficon quartz crystal microbalance and XTM-2 Deposition Monitor. Device testing was performed using a Kiethley 2400 Sourcemeter and Newport 1830-C Optical Power Meter with 818-SL Photodiode detector driven by LabVIEW 6.0 Software.

Results and Discussion

Figure 3:
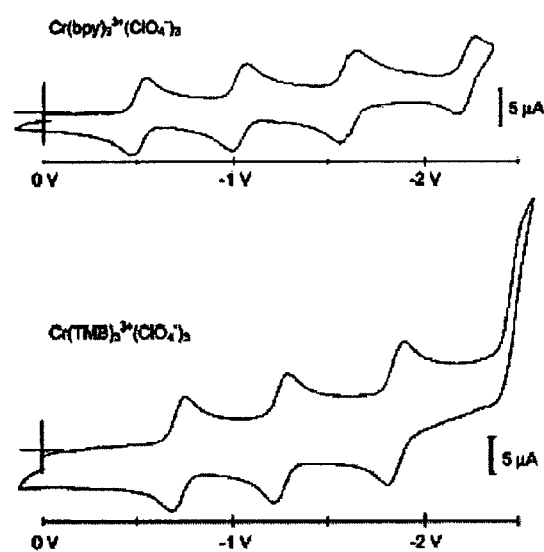
FIG. 3 shows a cyclic voltammetry graph of two different Cr complexes.

From cyclic voltammetry (FIG. 3 and literature, Morris et al., *J. Electroanal. Chem.*, 1983, 149, 115), the $E_{1/2}$ potentials for the reductions along with calculated $E_F$ and Φ, of [Ru(terpy)$_2$]$^0$, [Cr(bpy)$_3$]$^0$, and [Cr(TMB)$_3$]$^0$ are presented in Table 1 below.

As shown in Table 1, the TMB complex undergoes reductive processes at potentials significantly more negative than does the bpy analogue. It is believed that this potential difference in the reductive process is due to the electron-donating nature the methyl substituents on the ligands. Indeed, for this system, the fourth reduction (0/1−) is outside the electrochemical window available in acetonitrile solvent and the reduction potential was estimated by comparison to the other Cr complex.

The reduction potential data were obtained using either a Ag/Ag$^+$ 0.1 M in DMSO or saturated sodium chloride calomel (SSCE) reference electrode. Potentials are also reported relative to the standard electrode for electrochemical data, the NHE, by subtracting the difference in potential of the reference electrode used in the experiment from that of the NHE, 0.410 and 0.236 V, respectively. The $E_F$ vs NHE is calculated as the average of the half-wave potentials for the 1+/0 and 0/1− reductions, and the Φ is estimated by comparison of the energy of the NHE to the energy of a free electron in a vacuum, −4.60 eV.

Figure 4A:
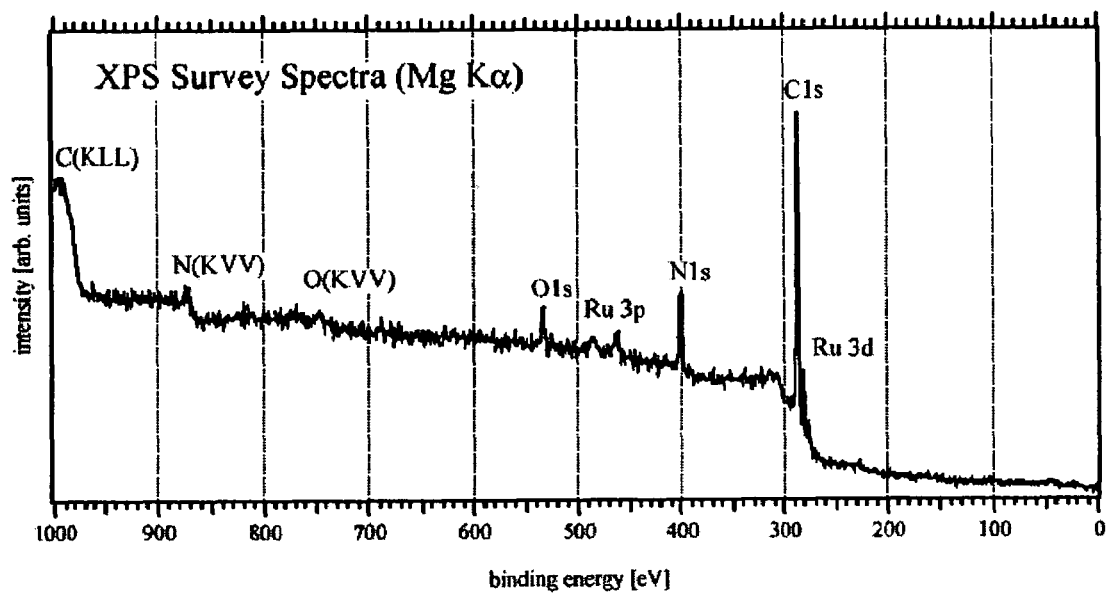
FIG. 4A is a XPS survey spectrum of vapor deposited $Ru(terpy)_2^0$.
Figure 4B:
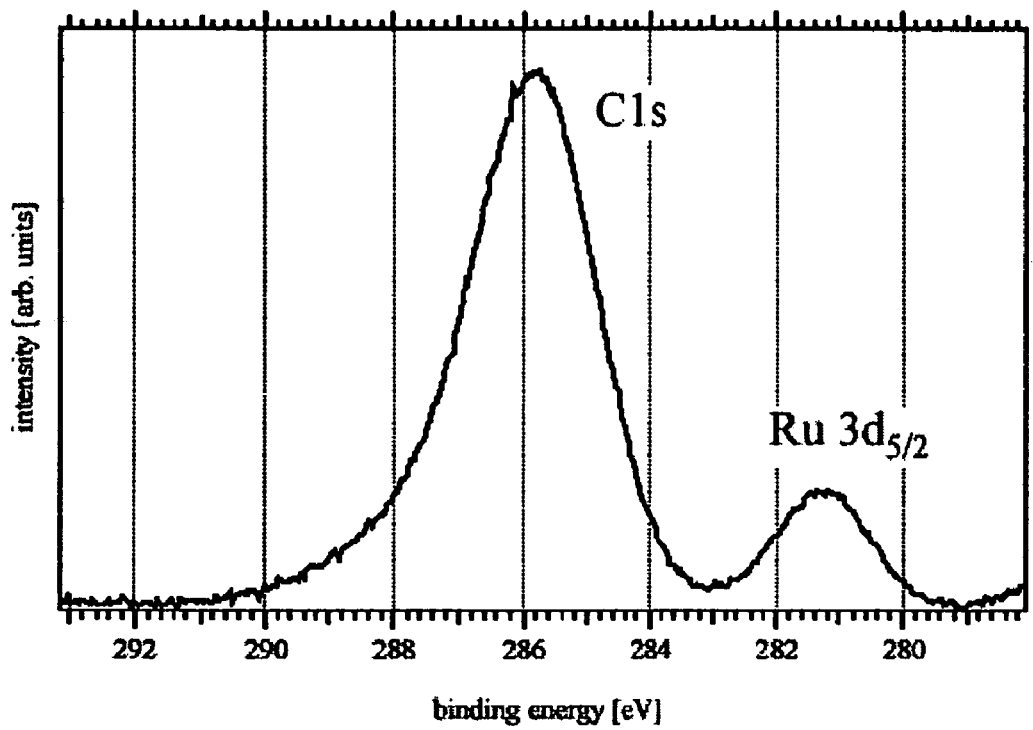
FIG. 4B is a high resolution XPS spectra of C, Ru, and N regions of $Ru(terpy)_2^0$.
Figure 4B:
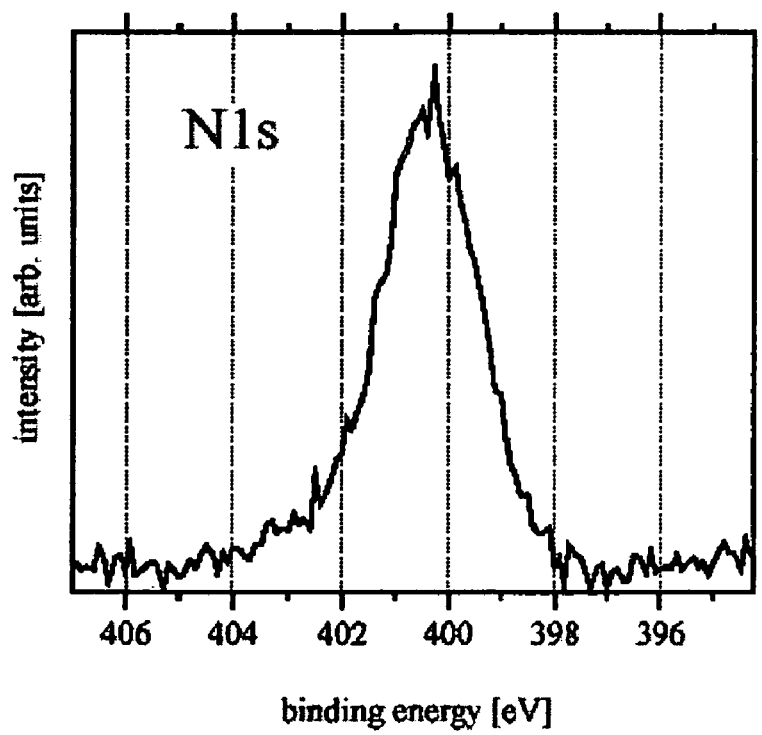
Figure 5:
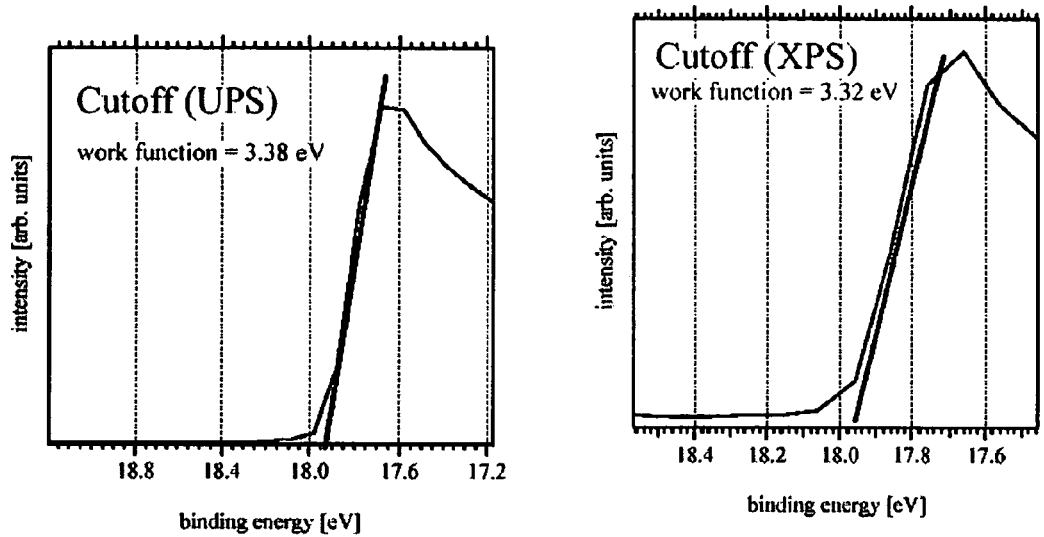
FIG. 5 shows UPS and XPS spectra binding energy graph of $Ru(terpy)_2^0$.

X-ray and ultraviolet photoelectron spectroscopy (XPS and UPS) were performed on a 200-Å-thick film of [Ru(terpy)$_2$]$^0$ thermally deposited on Pt foil. XPS spectra (FIGS. 4A and 4B) revealed the presence of carbon, nitrogen, and ruthenium, as expected, as well as oxygen. Without being bound by any theory, it is believed that the presence of oxygen is a result of accidental contact of the reduced LWOM with O$_2$ during the transfer process. The work function of the film was measured from the HBEC to be 3.32 and 3.38 eV, by XPS and UPS, respectively. See FIG. 5. These values are in good agreement with each other and are close to the value of 3.10 eV predicted from the electrochemical data. This Φ for [Ru(terpy)$_2$]$^0$ provided by photoelectron spectroscopy is within the range of commonly used metals for OLED cathodes (by comparison, Ca metal has a Φ of 2.9 eV).

Figure 6:
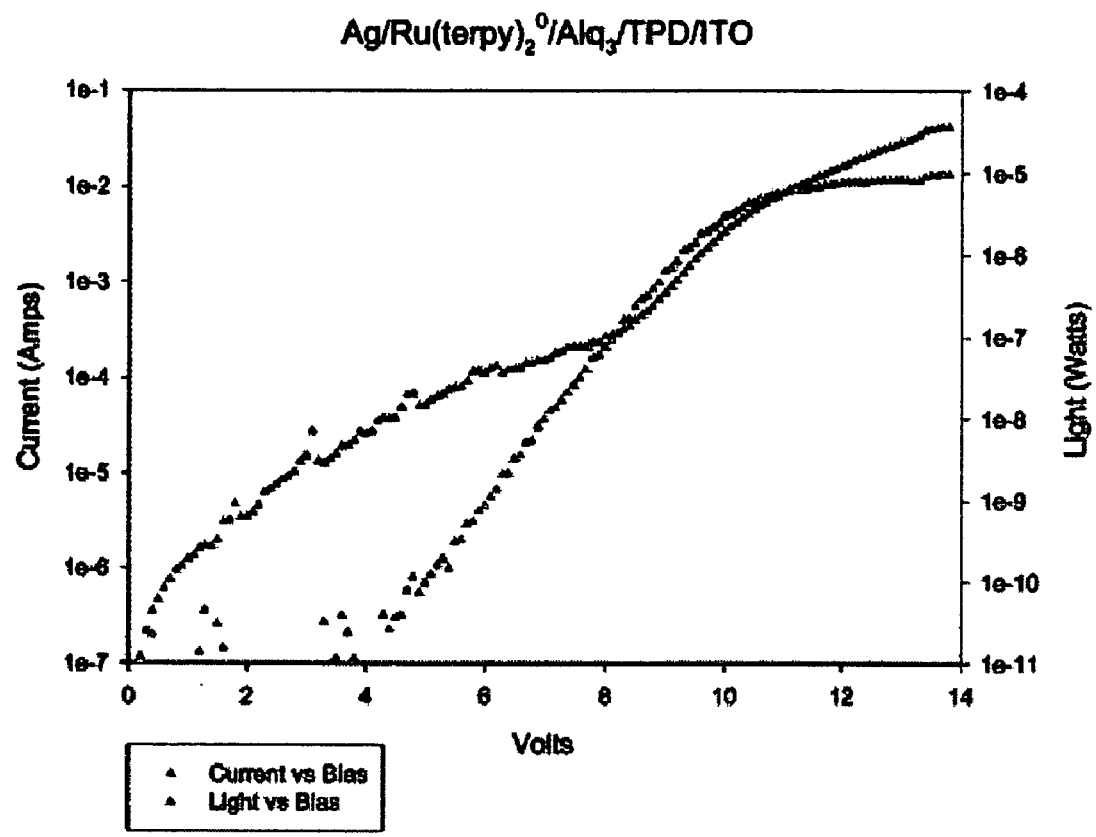
FIG. 6 is a graph of current vs. bias and light intensity vs. bias of a $[Ru(terpy)_2]^0$/Ag cathode.

OLEDs were constructed using [Ru(terpy)$_2$]$^0$ with the architecture Ag/LWOM/Alq$_3$(400 Å)/TPD(400 Å)/ITO. Performance for a typical device with [Ru(terpy)$_2$]$^0$ as the LWOM is shown in FIG. 6. Emission spectra for these devices peak in the 520 nm region typical of Alq$_3$-based devices.

Another OLEDs were prepared including a conducting polymer interlayer (PEDOT-PSS) between the ITO anode and the TPD hole-transport material. This approach has been shown to improve device performance by reducing the barrier to hole injection at the anode, resulting in increased device lifetime and efficiency. See, for example, Troadec et al., *Synth. Met.* 2001, 124, 49 and Elschner et al., *Synth. Met.* 2000, 111-112, 139. Devices containing this additional layer

TABLE 1

$E_{1/2}$ Potentials for Reductions of Metal Complexes. Conditions for Cyclic Voltammetry of Cr Complexes: Electrolyte, 0.1 M TBAPF$_6$ in CH$_3$CN; WE, Glassy C; CE., Pt Wire; Scan Rate, 100 mV/s

| | $E_{1/2}$ vs Ag/Ag$^+$ 0.1 M in DMSO, V | | | | $E_{1/2}$ vs NHE, V | | | |
|---|---|---|---|---|---|---|---|---|
| | 3+/2+ | 2+/1+ | 1+/0 | 0/1− | 1+/0 | 0/1− | $E_F$ calc., eV | Φ calc., eV |
| Ru(terpy)$_2$ | | −1.44* | −1.69* | −2.13* | −1.28 | −1.72 | −1.50 | 3.10 |
| Cr(bpy)$_3$ | −0.48 | −0.98 | −1.56 | −2.18 | −1.15 | −1.77 | −1.46 | 3.14 |
| Cr(TMB)$_3$ | −0.72 | −1.25 | −1.85 | −2.46** | −1.44 | −2.05** | −1.75 | 2.85 |

Figure 7:
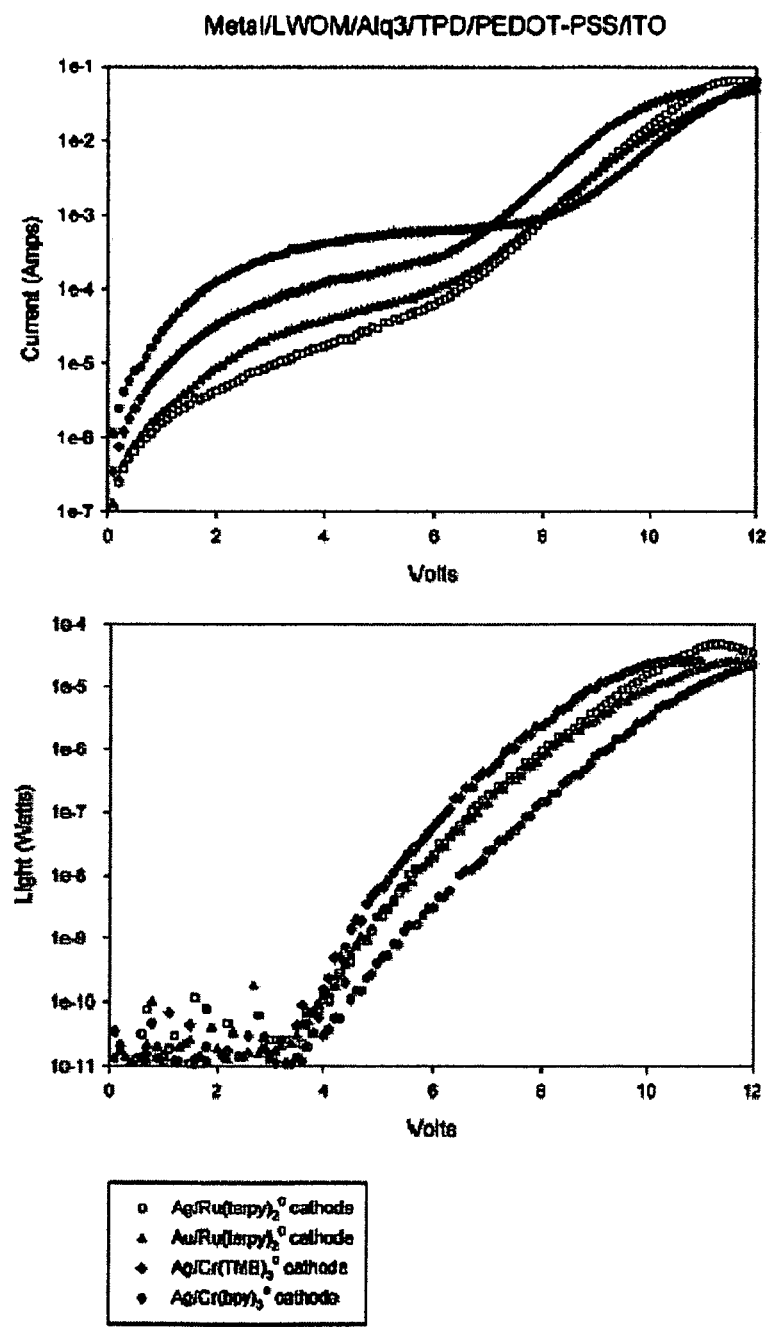
FIG. 7 is a graph showing performance of four OLEDs with cathodes of varying heteroaryl-metal coordination complexes of the present invention and covering metal layers.

*Values from the literature were originally reported vs SSCE (Morris et al., J. Electroanal. Chem., 1983, 149, 115) but have been converted for this table.
**Estimated by comparison with bpy complex.

for hole injection both passed more current and produced more light at a given voltage, as shown in FIG. 7.

Figure 8A:
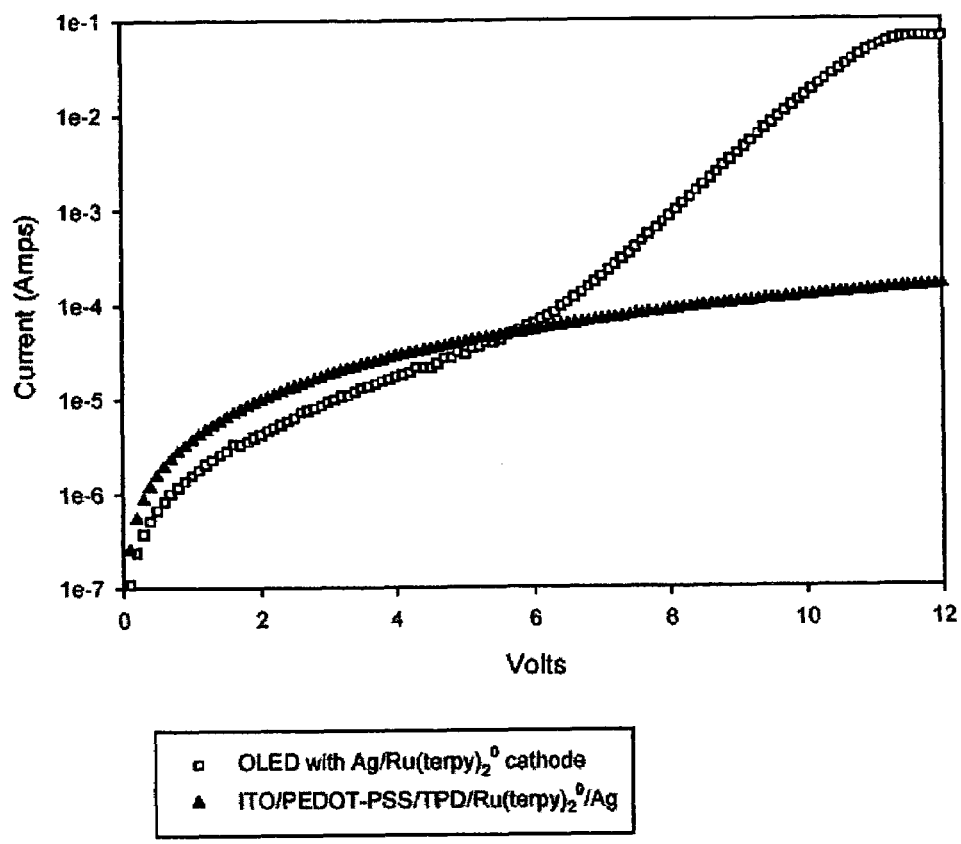
FIG. 8A is a Current (I) vs. Voltage (V) graph of a "hole-only" device with silver, along with the analogous OLED from FIG. 7.
Figure 8B:
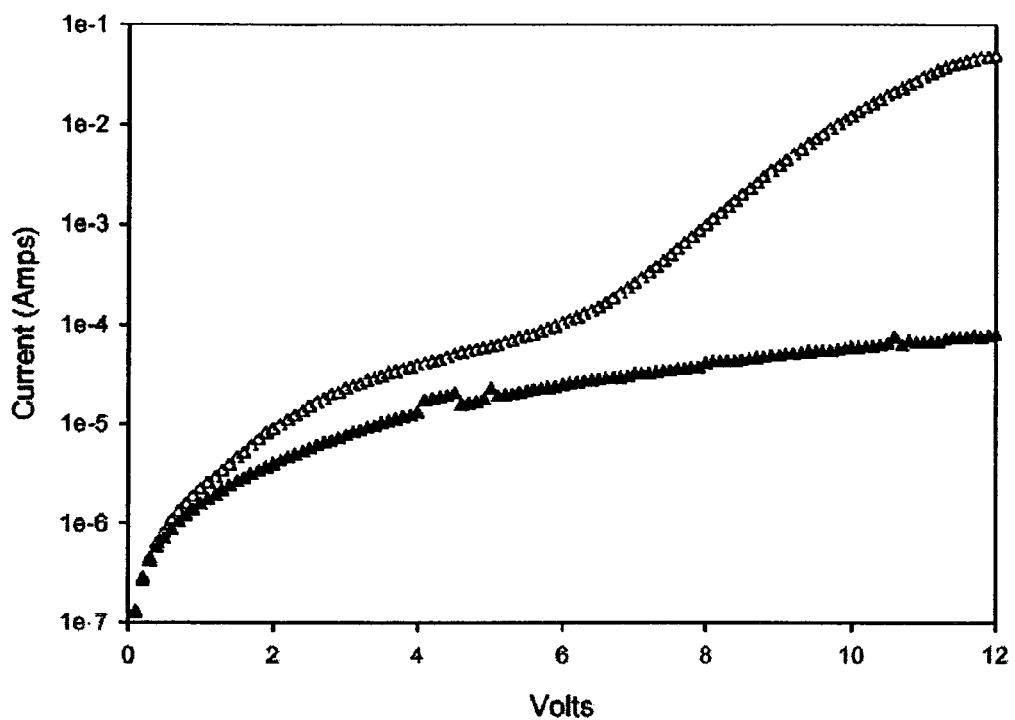
FIG. 8B is a Current (I) vs. Voltage (V) graph of a "hole-only" device with gold, along with the analogous OLED from FIG. 7.

Analogous OLEDs were also made with gold, which has a very high Φ of 5.2 eV. Devices with architecture Au/LWOM/ Alq$_3$(400 Å)/TPD(200 Å)/PEDOT-PSS/ITO performed very similarly to those with silver (see FIG. 7). Accordingly, it appears that the nature of the metal contact is of secondary importance to the underlying LWOM. In contrast, when devices are constructed in exactly the same manner, but omitting the LWOM layer, they emit only weakly and at high voltages with Ag metal cathodes and not at all when Au is used. "Hole only" devices without Alq$_3$ also were constructed, consisting of the layers ITO/PEDOT-PSS/TPD (800 Å)/Ru(terpy)$_2$$^0$/Metal, with both Ag and Au metals. The current/voltage response of such devices (FIGS. 8A and 8B) with the two metals was very similar, and unlike in OLEDs including Alq$_3$, the current passed at bias greater than about 3 V appeared to be essentially ohmic.

FIG. 7 also shows the performance of OLEDs with [Cr(TMB)$^3$]$^0$ and [Cr(bpy)$_3$]$^0$ as the cathode materials. As can be seen in FIG. 7, a device using the TMB complex emits more light, while passing more current, than a comparable device containing [Ru(terpy)$_2$]$^0$. Without being bound by any theory, it is believed that this is attributed to the lower Φ of the reduced complex, which in turn yields a lower barrier for electron injection. Referring again to FIG. 7, devices using [Cr(bpy)$^3$]$^0$ produce less light emission than those with [Ru(terpy)$_2$]$^0$.

Figure 9:
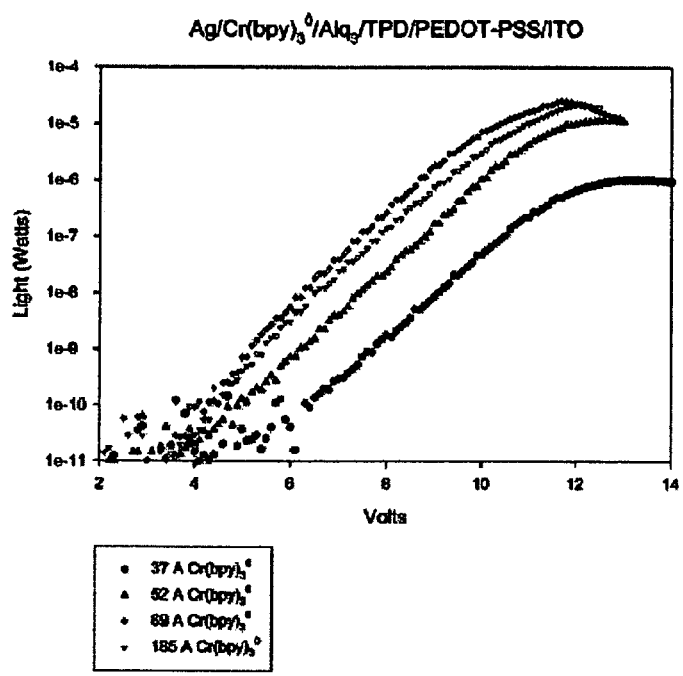
FIG. 9 is a performance graph of OLEDs with different thickness of $[Cr(bpy)_3]^0$ in the $[Cr(bpy)_3]^0$/Ag cathode.
Figure 10:
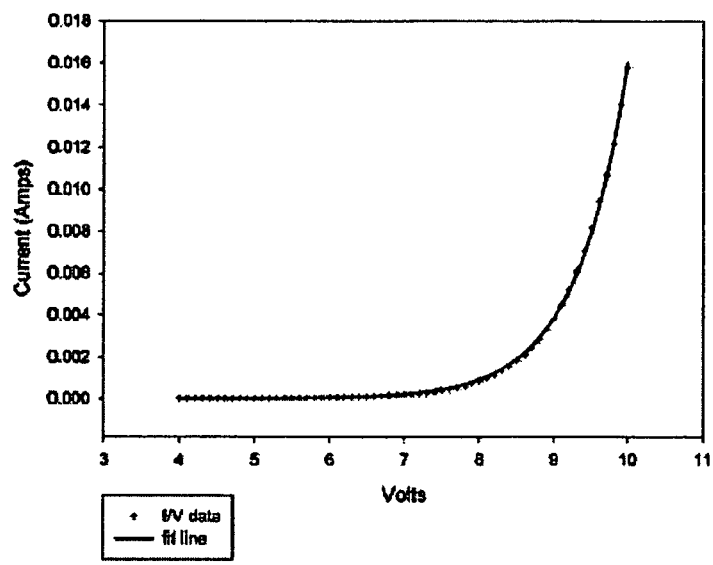
FIG. 10 is a graph showing current-voltage performance of an OLED of construction Ag/$[Ru(terpy)_2]^0$/Alq$_3$/TPD/PEDOT-PSS/ITO (as shown in FIG. 7) and a fit to the equation $I \propto e^{cV}$.

In general, the performance of OLEDs having a relatively thick layer of LWOM is superior to those with thin layers (i.e., <100 Å). This is in contrast to what was observed for more insulating materials such as inorganic salts and CuPc where only very thin layers of less than 50 Å are effective. Light emission from several devices differing only in the thickness of LWOM is shown in FIG. 9. As can be seen, the OLEDs having thicker layers (89 or 185 Å) of [Cr(bpy)$_3$]$^0$ produce several orders of magnitude more light than do those with only 37 Å.

It is believed that analysis of the current-voltage, i.e., I-V, curves can provide understanding of the nature of the electron-injection process in OLEDs. For example, in devices governed by trap-limited electron conduction in the Alq$_3$ layer, the power law equation I ∝ V$^{m-1}$ (where m is typically 7-9) describes the I-V relationship. In this case, the current is limited by transport characteristics of the Alq$_3$, rather than a barrier to injection at the interface with the cathode. For the OLEDs using metal-ligand complexes of the present invention, an exponential dependence of I on V is well obeyed. However, I-V curve does not fit to the power law relation satisfactorily. The I-V performance, in the useful operating range of 4-10 V, of the previously discussed [Ru(terpy)$_2$]$^0$ containing device (with PEDOT-PSS), along with the exponential relationship I ∝ e$^{cV}$ is shown in FIG. 9. This suggests that some OLED devices derived from metal-ligand coordination complexes of the present invention are governed not by trap-limited conduction in the Alq$_3$, but rather by an injection-limited mechanism.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/ or equivalent structures, functions, ranges or steps are disclosed herein, and without intending to publicly dedicate any patentable subject matter. All references cited herein are incorporated by reference in their entirety.

What is claimed is:

1. An electrode composition comprising:
   a current conducting material; and
   a heteroaryl-metal complex in contact with said current conducting material, wherein said heteroaryl-metal complex is of the formula:

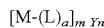

wherein
   a is an integer from 1 to 6;
   m and n are absolute value of oxidation state of Y or [M-(L)$_a$], respectively; or if [M-(L)$_a$] is not charged Y is not present and said heteroaryl-metal complex is of the formula M(L)$_a$;
   M is a metal;
   Y is a counterion; and
   each L is independently a heteroaryl moiety containing one or more coordinating heteroatoms.

2. The electrode composition of claim 1 having work function of about 3.5 eV or less.

3. The electrode composition of claim 1, wherein said heteroaryl-metal complex is of the formula M-(L)$_a$.

4. The electrode composition of claim 3, wherein a is an integer of 2 or 3.

5. The electrode composition of claim 4, wherein M is a transition metal.

6. The electrode composition of claim 5, wherein M is selected from the group consisting of Ru, Cr, Fe, Zn, Co, Mn, Cu, Os, Rh, and Ni.

7. The electrode composition of claim 6, wherein M is selected from the group consisting of Ru and Cr.

8. The electrode composition of claim 5, wherein L is a polypyridyl or phenanthroline moiety.

9. The electrode composition of claim 8, wherein L is selected from the group consisting of optionally substituted 2,2'-bipyridyl, optionally substituted 1,10-phenanthroline, optionally substituted 2,2',6',2"-terpyridyl and a derivative thereof.

10. The electrode composition of claim 8, wherein L is a polypyridyl moiety.

11. The electrode composition of claim 10, wherein L is selected from the group consisting of 4,4',5,5'-tetramethyl-2,2'-bipyridyl; 2,2'-bipyridyl; and 2,2', 6', 2"-terpyridy.

12. The electrode composition of claim 1, wherein said current conducting material is a metal or a metal alloy.

13. The electrode composition of claim 12, wherein said current conducting material comprises silver, gold or a mixture thereof.

14. An electronic device comprising an electrode of claim 1.

15. A composition comprising a metal or a metal alloy in contact with a heteroaryl-metal coordination complex, wherein said heteroaryl-metal coordination complex is of the formula:

wherein
a is an integer from 1 to 6;
M is a metal;
and
each L is independently a heteroaryl moiety containing one or more coordinating heteroatoms.

* * * * *